United States Patent
Inoue

(10) Patent No.: US 11,662,396 B2
(45) Date of Patent: May 30, 2023

(54) POWER RECEIVING APPARATUS, CONTROL METHOD, AND STORAGE MEDIUM

(71) Applicant: CANON KABUSHIKI KAISHA, Tokyo (JP)

(72) Inventor: Hajime Inoue, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/444,409

(22) Filed: Aug. 4, 2021

(65) Prior Publication Data
US 2022/0043074 A1 Feb. 10, 2022

(30) Foreign Application Priority Data
Aug. 7, 2020 (JP) ............................. JP2020-135066

(51) Int. Cl.
| | | |
|---|---|---|
| *H02J 50/12* | (2016.01) | |
| *G01R 31/58* | (2020.01) | |
| *G08B 21/18* | (2006.01) | |
| *G01R 31/00* | (2006.01) | |

(52) U.S. Cl.
CPC ............. *G01R 31/58* (2020.01); *G01R 31/00* (2013.01); *G08B 21/18* (2013.01); *G08B 21/185* (2013.01)

(58) Field of Classification Search
CPC ........ G01R 31/00; G01R 31/50; G01R 31/59; G01R 31/58; G01R 31/60; G08B 21/185
See application file for complete search history.

(56) References Cited

U.S. PATENT DOCUMENTS

| | | | | |
|---|---|---|---|---|
| 7,672,812 B2 * | 3/2010 | Stoupis | ................... | G01R 31/58 324/527 |
| 2009/0061678 A1 * | 3/2009 | Minoo | ..................... | G06F 21/44 439/502 |
| 2010/0225176 A1 * | 9/2010 | Bhargava | .................. | H02J 4/00 307/125 |
| 2011/0050164 A1 * | 3/2011 | Partovi | ............... | H02J 7/00304 320/108 |
| 2013/0082662 A1 * | 4/2013 | Carre | ........................ | H02J 7/00 320/134 |
| 2015/0155912 A1 * | 6/2015 | Winward | ............. | A61B 5/7225 375/257 |

(Continued)

FOREIGN PATENT DOCUMENTS

JP 2015-039248 A 2/2015

*Primary Examiner* — Hai Phan
*Assistant Examiner* — Son M Tang
(74) *Attorney, Agent, or Firm* — Cowan, Liebowitz & Latman, P.C.

(57) ABSTRACT

A power receiving apparatus includes a determination unit and a display unit. The determination unit determines whether or not each of a power transmitting apparatus and a cable connected to the power receiving apparatus meets a predetermined condition relating to safety of power transmission. The display unit displays first information indicating that the power transmitting apparatus does not meet the predetermined condition in a case where the power transmitting apparatus does not meet the predetermined condition. The display unit displays second information indicating that the cable does not meet the predetermined condition in a case where the cable does not meet the predetermined condition.

11 Claims, 8 Drawing Sheets

(56) References Cited

U.S. PATENT DOCUMENTS

| | | | |
|---|---|---|---|
| 2015/0188346 A1* | 7/2015 | Oku | H02J 7/00047 |
| | | | 320/138 |
| 2015/0296619 A1* | 10/2015 | Rooyakkers | H05K 1/117 |
| | | | 174/74 R |
| 2015/0346792 A1* | 12/2015 | Rathi | G06F 1/26 |
| | | | 713/310 |
| 2016/0134381 A1* | 5/2016 | Malinin | H04B 1/707 |
| | | | 375/130 |
| 2016/0140372 A1* | 5/2016 | Deal | G06K 7/10851 |
| | | | 235/462.15 |
| 2016/0195578 A1* | 7/2016 | Huang | G01R 27/14 |
| | | | 320/134 |
| 2017/0104361 A1* | 4/2017 | Sato | G05B 15/02 |
| 2017/0179650 A1* | 6/2017 | Spiel | H01R 24/22 |
| 2017/0227587 A1* | 8/2017 | Knoedgen | G01R 27/16 |
| 2018/0060201 A1* | 3/2018 | Newberry | G06F 13/385 |
| 2019/0033937 A1* | 1/2019 | Inoue | H02J 7/00038 |
| 2019/0207416 A1* | 7/2019 | Ellis | H02M 7/003 |
| 2019/0260198 A1* | 8/2019 | Sonehara | G01R 31/50 |
| 2019/0312462 A1* | 10/2019 | Shichino | H02J 50/60 |
| 2020/0028374 A1* | 1/2020 | Lenhof | H02J 7/00036 |
| 2020/0244060 A1* | 7/2020 | Henke | G06F 3/0484 |
| 2022/0043074 A1* | 2/2022 | Inoue | G01R 31/58 |
| 2022/0312547 A1* | 9/2022 | Sakashita | G06F 1/266 |

* cited by examiner

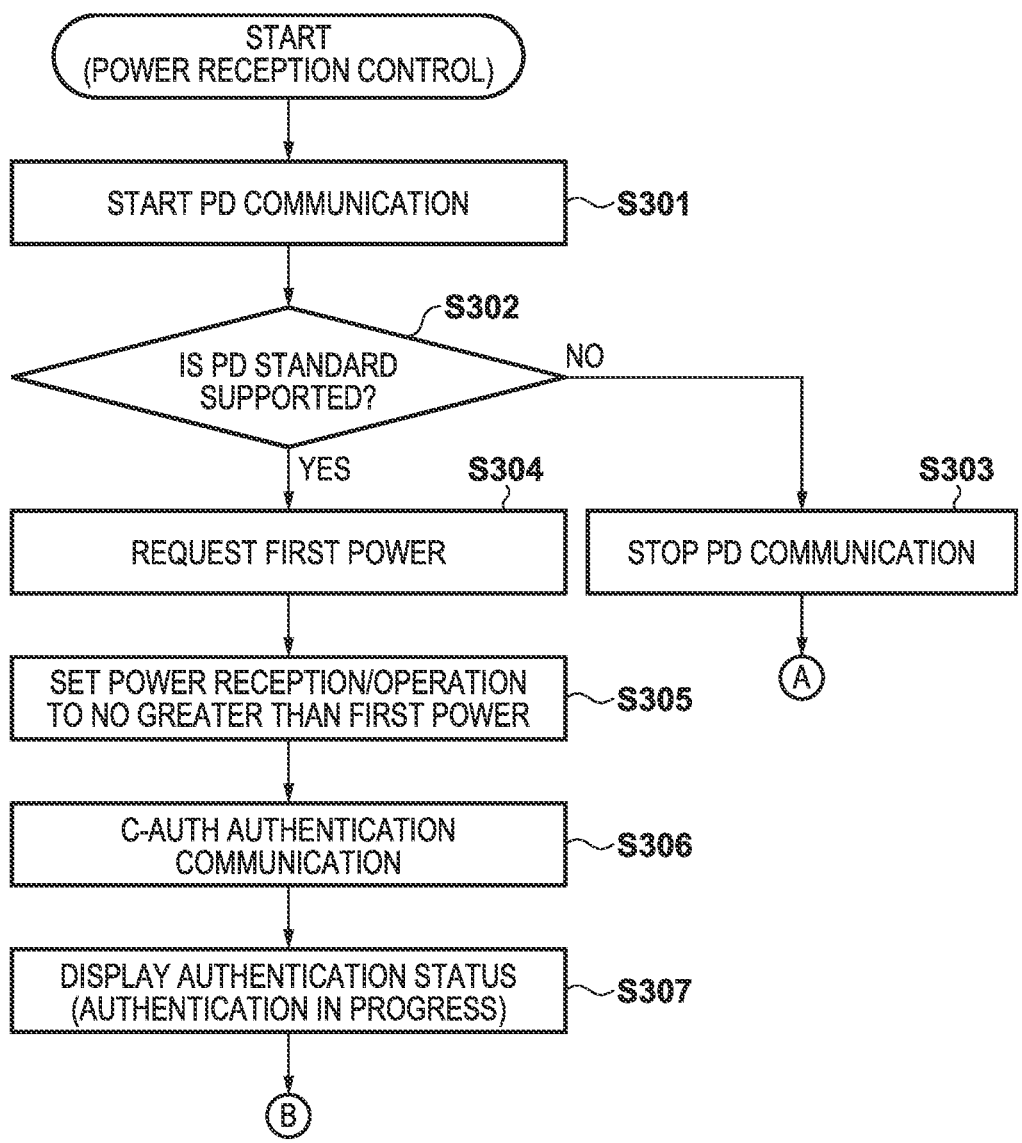

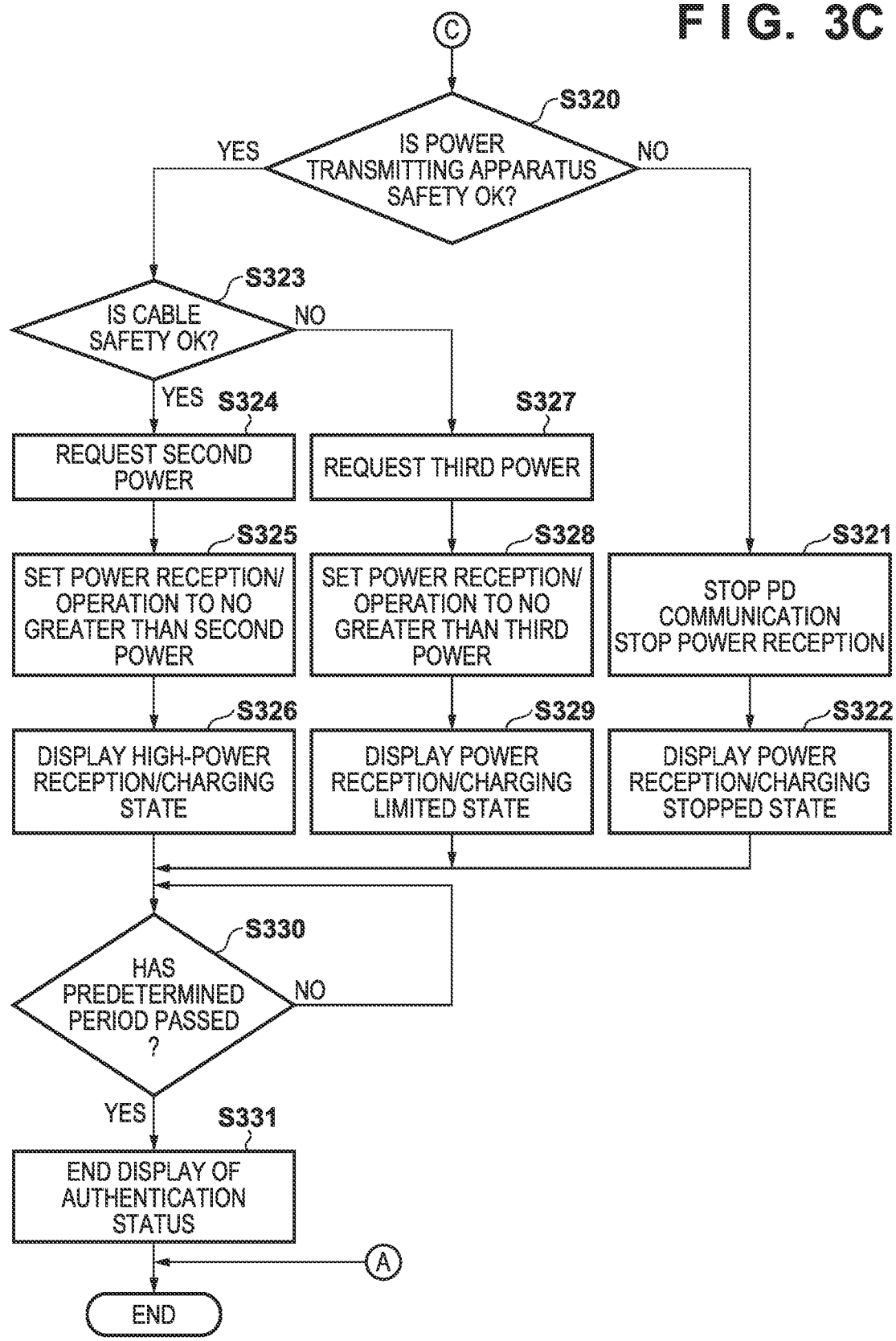

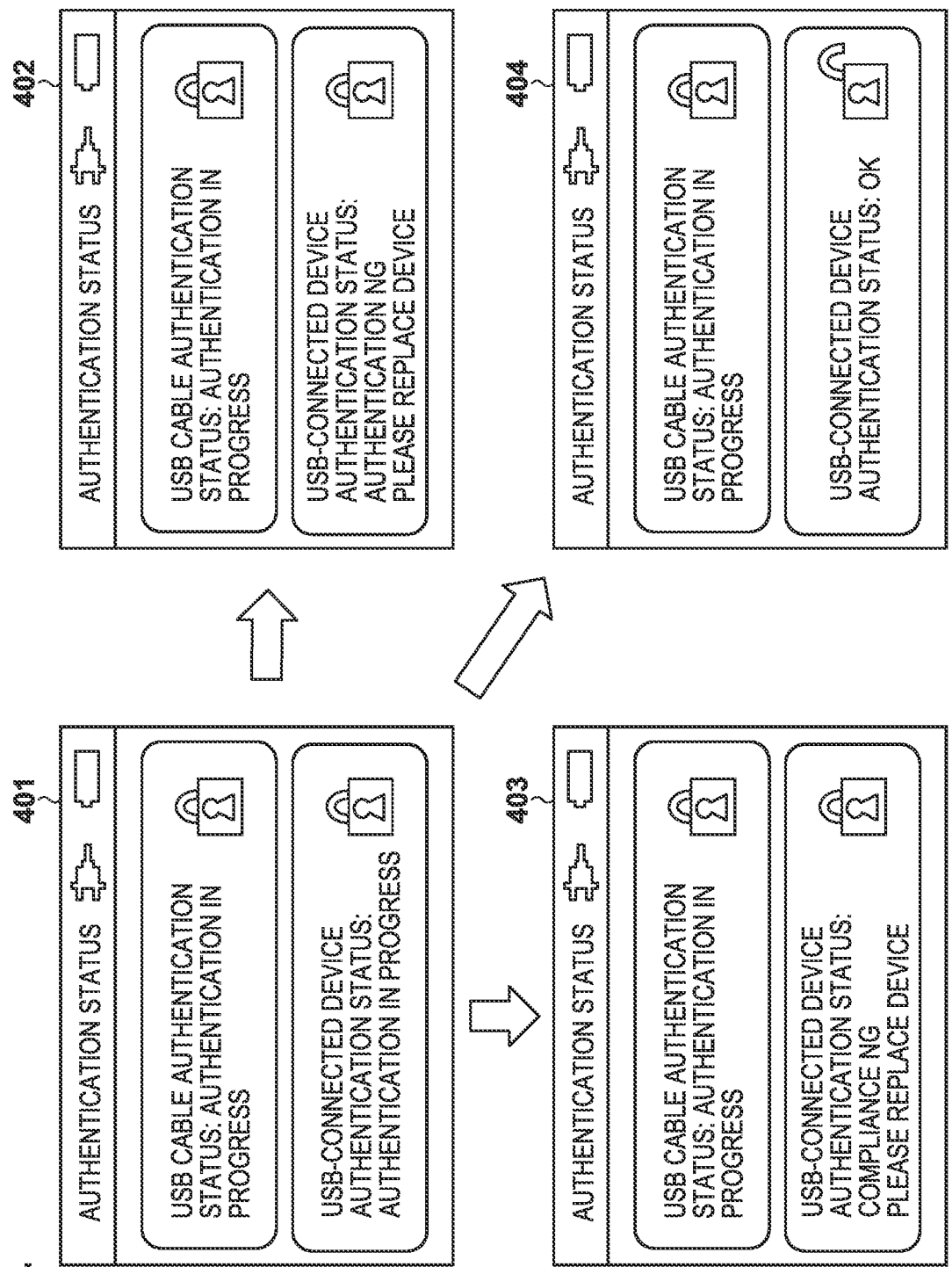

FIG. 5
USB CABLE AUTHENTICATION
STATUS: AUTHENTICATION NG
PLEASE REPLACE CABLE  ~501
USB CABLE AUTHENTICATION
STATUS: COMPLIANCE NG
PLEASE REPLACE CABLE  ~502
USB CABLE AUTHENTICATION
STATUS: OK  ~503

POWER RECEIVING APPARATUS, CONTROL METHOD, AND STORAGE MEDIUM

BACKGROUND

Field of the Disclosure

Aspects of the disclosure generally relate to a power receiving apparatus, a method for controlling the power receiving apparatus, and a storage medium.

Description of the Related Art

With respect to a wired interface for communication to be connected to an electronic apparatus such as a digital camera, there is a technique that enables power to be transmitted as data is being transferred. USB (Universal Serial Bus) standard can be given as a standard that defines such a technique.

Additionally, USB PD (Power Delivery) standard enables a power receiving apparatus to be connected to a power transmitting apparatus, such as a USB host controller or an AC adapter, by a USB cable, and enables the supply of a maximum of 100 W of power from the power transmitting apparatus to the power receiving apparatus. When a power transmitting apparatus and a power receiving apparatus that support the USB PD standard are connected, Power Negotiation communication (negotiation communication) is performed. This communication enables power information to be exchanged between the apparatuses, and enables the power transmitting apparatus to supply power requested by the power receiving apparatus.

Incidentally, it is generally known that there are power transmitting apparatuses, power receiving apparatuses, and cables that have USB standard interfaces but do not properly support the USB standard. For apparatuses and cables that do not properly support the USB standard, there is no guarantee that operations, protective functions, or the like relating to the transfer of power comply with the standard. It may therefore not be possible to guarantee safety when transferring a large amount of power using such apparatuses and cables.

The USB PD standard defines Security communication (C-AUTH authentication communication), in which after the negotiation communication is complete, the power transmitting apparatus and the power receiving apparatus exchange authentication information with each other to mutually confirm whether or not the apparatuses properly support the USB standard. The power receiving apparatus can also confirm whether or not a cable properly supports the USB standard through C-AUTH authentication communication. Accordingly, performing C-AUTH authentication communication before transferring a large amount of power makes it possible to improve the safety.

Japanese Patent Laid-Open No. 2015-39248 discloses a technique in which a power transmitting apparatus detects an increase in supplied power, authenticates a connected power receiving apparatus, and limits the supply of power according to a result of the authentication.

There are situations where, as a result of the C-AUTH authentication communication performed by the power receiving apparatus for the power transmitting apparatus and the cable, it is determined that at least one of the power transmitting apparatus and the cable does not properly support the USB standard. In this case, the power receiving apparatus may behave differently than when the power transmitting apparatus and the cable properly support the USB standard (e.g., may stop receiving power or the like). However, it is not easy for a user to determine whether only the power transmitting apparatus does not properly support the USB standard, only the cable does not properly support the USB standard, or both the power transmitting apparatus and the cable do not properly support the USB standard. The technique of Japanese Patent Laid-Open No. 2015-39248 cannot solve such a problem.

SUMMARY

According to various embodiments, a user can know whether or not a power transmitting apparatus or a cable meets a predetermined condition relating to safety.

According to various embodiments, there is provided a power receiving apparatus comprising: a determination unit that determines whether or not each of a power transmitting apparatus and a cable connected to the power receiving apparatus meets a predetermined condition relating to safety of power transmission; and a display unit that displays first information indicating that the power transmitting apparatus does not meet the predetermined condition in a case where the power transmitting apparatus does not meet the predetermined condition, and displays second information indicating that the cable does not meet the predetermined condition in a case where the cable does not meet the predetermined condition.

According to various embodiments, there is provided a method comprising: determining whether or not each of a power transmitting apparatus and a cable connected to the power receiving apparatus meets a predetermined condition relating to safety of power transmission; displaying first information indicating that the power transmitting apparatus does not meet the predetermined condition in a case where the power transmitting apparatus does not meet the predetermined condition; and displaying second information indicating that the cable does not meet the predetermined condition in a case where the cable does not meet the predetermined condition.

According to various embodiments, there is provided a non-transitory storage medium which stores a program for causing a computer to execute a method, the method comprising: determining whether or not each of a power transmitting apparatus and a cable connected to the power receiving apparatus meets a predetermined condition relating to safety of power transmission; displaying first information indicating that the power transmitting apparatus does not meet the predetermined condition in a case where the power transmitting apparatus does not meet the predetermined condition; and displaying second information indicating that the cable does not meet the predetermined condition in a case where the cable does not meet the predetermined condition.

Further aspects of various embodiments will become apparent from the following description of the disclosure.

BRIEF DESCRIPTION OF THE DRAWINGS

FIG. 3A is a flowchart illustrating a power reception control process performed by a power receiving apparatus 100.

FIG. 3C is a flowchart illustrating the power reception control process performed by the power receiving apparatus 100.

FIG. 4 is a diagram illustrating an example of an authentication status screen.

FIG. 5 is a diagram illustrating an example of the display of an authentication status of a cable 122.

DESCRIPTION OF THE EMBODIMENTS

Figure 1:
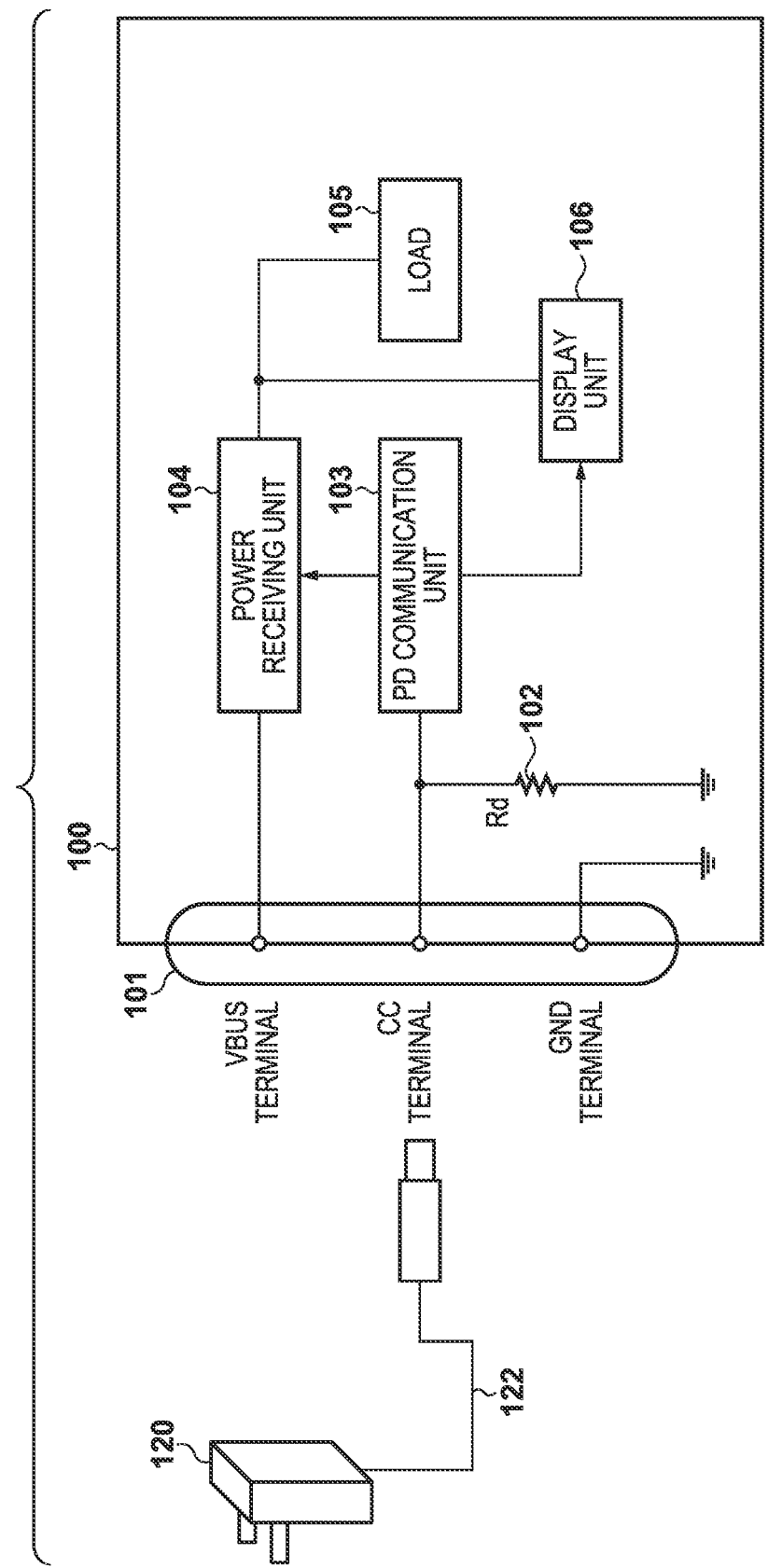
FIG. 1 is a diagram illustrating a system configuration according to a first embodiment.

Exemplary embodiments, features, and aspects of the disclosure will be described below with reference to the drawings. However, aspects of the disclosure are not limited to the following embodiments. In the attached drawings, the same reference numerals are given to the same or similar configurations, and redundant description thereof is omitted.

First Embodiment

FIG. 1 is a diagram illustrating a system configuration according to a first embodiment. In FIG. 1, 120 indicates a power transmitting apparatus. Here, the power transmitting apparatus 120 is illustrated as an AC adapter that uses AC power as a power supply source. However, the power transmitting apparatus 120 is not limited to an AC adapter, and may be, for example, a personal computer (PC) including a USB connector, a portable battery, or the like. 100 indicates a power receiving apparatus that receives power from the power transmitting apparatus 120.

122 indicates a cable. The cable 122 includes USB Type-C plugs on both ends and connects the power transmitting apparatus 120 to the power receiving apparatus 100. Inside the cable 122 is a built-in eMarker that provides information about specifications, the manufacturer, or the like electronically.

Figure 2:
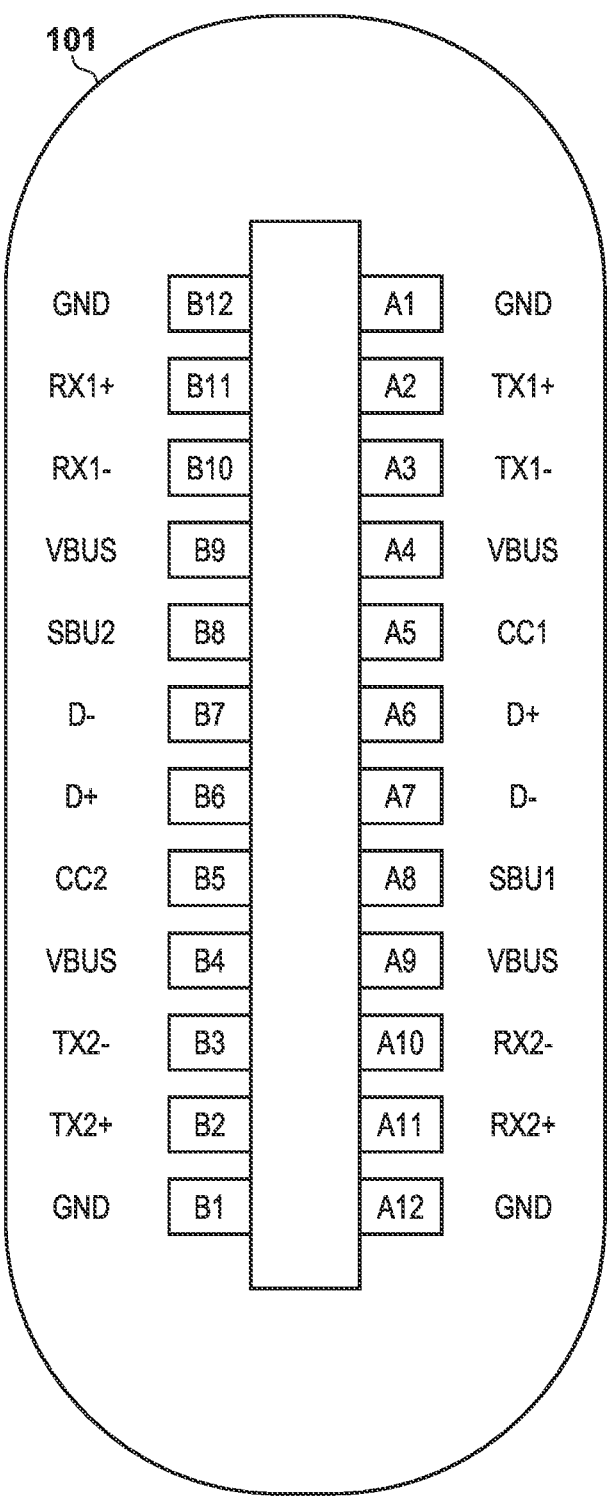
FIG. 2 is a diagram illustrating a pin layout of a connector 101.

In the power receiving apparatus 100, 101 indicates a connector for receiving power from the power transmitting apparatus 120 (a communication interface capable of receiving power based on a predetermined power transmission standard), and is configured as a USB Type-C receptacle. The connector 101 is defined by the pins illustrated in FIG. 2, and has a VBUS terminal used to supply power, a CC (Configuration Channel) terminal for obtaining information about power supply capabilities of the power transmitting apparatus 120, a GND terminal serving as a signal reference, or the like.

102 indicates a pull-down resistor which is connected between the CC terminal and the GND terminal of the connector 101, and which is defined in USB Type-C standard. The pull-down resistor 102 is used for the power transmitting apparatus 120 to determine a connection with the power receiving apparatus 100, for the power receiving apparatus 100 to determine the power supply capabilities of the power transmitting apparatus 120 by a voltage value, or the like.

103 indicates a PD communication unit which is connected to the CC terminal of the connector 101, and which performs communication based on the USB PD standard and determines whether or not the connected power transmitting apparatus 120 supports the USB PD standard.

When the power transmitting apparatus 120 is capable of performing USB PD communication, the power receiving apparatus 100 uses the PD communication unit 103 to perform negotiation communication based on a communication protocol defined in the USB PD standard, and requests the power transmitting apparatus 120 to supply a desired power. The power receiving apparatus 100 also uses the PD communication unit 103 to perform authentication communication based on the communication protocol defined in the USB PD standard, and authenticates whether or not the power transmitting apparatus 120 is an apparatus which properly supports the USB PD standard. In the first embodiment, the PD communication unit 103 has at least two requested power values requested of the power transmitting apparatus 120. One of the two requested power values is assumed to be a minimum power at which the power receiving apparatus 100 can authenticate that the power transmitting apparatus 120 is an apparatus which properly supports the USB PD standard, and furthermore at which a display operation can be performed in a display unit 106.

104 indicates a power receiving unit which is connected to the VBUS terminal of the connector 101 and which supplies power to each component of the power receiving apparatus 100 using power supplied from the power transmitting apparatus 120. The power receiving unit 104 controls the power to be supplied from the power transmitting apparatus 120 based on communication from the PD communication unit 103.

105 indicates a load which is constituted by various types of modules and which operates by consuming power from the power receiving unit 104. The power consumed by the load 105 varies depending on the operating state of the power receiving apparatus 100. The power receiving apparatus 100 is a digital camera, for example. In this case, the various types of modules constituting the load 105 include an imaging lens that zooms and focuses a subject image, an image sensor that converts the subject image into electrical image information, an operation unit including various types of switches, or the like.

106 indicates the display unit, which displays a current authentication result or the like. The display unit 106 is, for example, an LCD, organic EL, reflective liquid crystal, or the like.

Figure 3B:
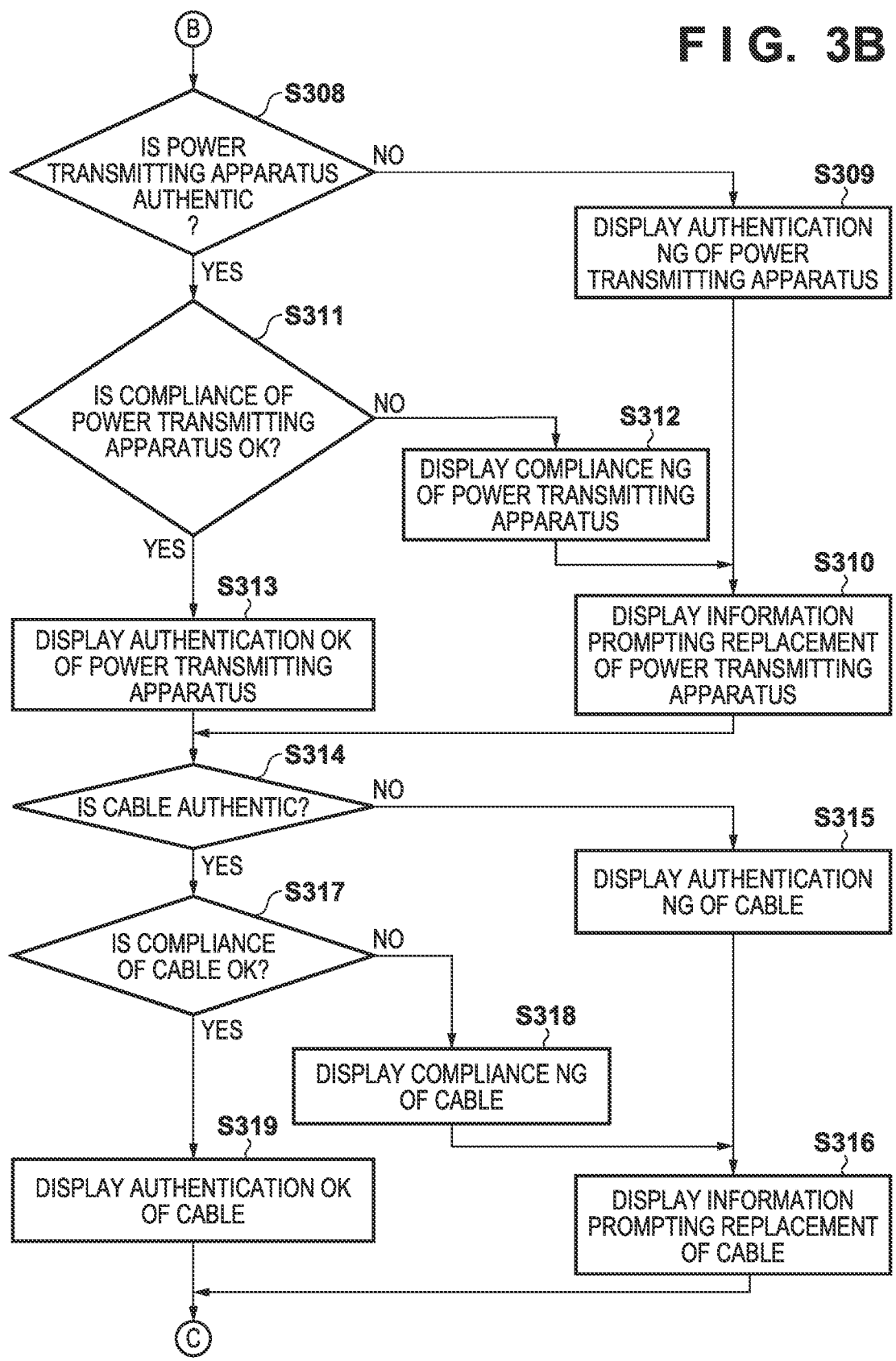
FIG. 3B is a flowchart illustrating the power reception control process performed by the power receiving apparatus 100.

FIGS. 3A to 3C are a flowchart illustrating a power reception control process performed by the power receiving apparatus 100. The power reception control process illustrated in the flowchart of FIGS. 3A to 3C is started when the power transmitting apparatus 120 is connected to the power receiving apparatus 100 by the cable 122.

In step S301, the PD communication unit 103 starts exchanging information with the power transmitting apparatus 120 based on the communication protocol of the USB PD standard.

In step S302, the PD communication unit 103 determines whether or not the power transmitting apparatus 120 supports the USB PD standard. Here, the PD communication unit 103 determines whether or not the connected power transmitting apparatus 120 supports the PD standard according to whether or not predetermined information based on the communication protocol of the USB PD standard has been received from the power transmitting apparatus 120. The PD communication unit 103 determines that the connected power transmitting apparatus 120 does not support the USB PD standard when the predetermined information based on the communication protocol of the USB PD standard cannot be correctly received, or when the predetermined information cannot be received within a predetermined period.

Here, the "predetermined information" is power information indicating the power that can be supplied by the connected power transmitting apparatus 120. In the first embodiment, as an example, power information indicating that the power transmitting apparatus 120 is capable of supplying 0.5 W (5 V, 100 mA), 15 W (5 V, 3 A), and 27 W (9 V, 3 A) of power, respectively, is received. The predetermined period may be a period defined in the USB PD standard, e.g., 310 ms.

If it is determined in step S302 that the power transmitting apparatus 120 does not support the USB PD standard, the power reception control process proceeds to step S303. In step S303, the PD communication unit 103 stops the communication process. The PD communication unit 103 may also control the power receiving unit 104 to receive a supply of power compliant with the USB Type-C standard. The power reception control process illustrated in the flowchart of FIGS. 3A to 3C then ends.

On the other hand, if it is determined in step S302 that the power transmitting apparatus 120 supports the USB PD standard, the power reception control process proceeds to step S304. In step S304, the PD communication unit 103 exchanges information based on the communication protocol of the USB PD standard, and requests the power transmitting apparatus 120 to supply first power. Here, the "first power" may be the minimum power at which the power receiving apparatus 100 can perform authentication communication of step S306 and can perform a display in the display unit 106. The first power is determined in the form of a selection made from the power information indicating the power that can be supplied by the power transmitting apparatus 120, received in step S302. In the first embodiment, as an example, the PD communication unit 103 requests 0.5 W (5 V, 100 mA) as the first power.

In step S305, based on control by the PD communication unit 103, the power receiving unit 104 performs control such that the power to be supplied from the power transmitting apparatus 120 is no greater than the first power. In the first embodiment, the power receiving unit 104 controls a current value to be supplied from the power transmitting apparatus 120 to no greater than 100 mA. Additionally, the power receiving unit 104 supplies power to each constituent element in the power receiving apparatus 100 so that at a minimum, the power receiving apparatus 100 can perform authentication communication of step S306 and can perform a display in the display unit 106 using no more than the supplied first power. The load 105 may be set to an operating state that consumes less power in order to prevent a power shortage.

In step S306, the PD communication unit 103 performs a process for determining whether or not the power transmitting apparatus 120 and the cable 122 respectively meet a predetermined condition relating to the safety of power transmission (a safety condition). The safety condition is not particularly limited, and can be selected as appropriate according to the type of standard used for power transmission (the power transmission standard). In the example used to describe the first embodiment, the power transmission standard is the USB PD standard, and the safety condition is that authenticity is confirmed through C-AUTH authentication and a compliance test is confirmed as having been passed. However, as another example, the safety condition may be a condition that the authenticity is confirmed through C-AUTH authentication (e.g., that whether the compliance test has been passed or failed is irrelevant). The authentication method used to confirm the authenticity is not limited to C-AUTH authentication, and an authentication method according to any authentication standard can be used as long as the use thereof is permitted by the power transmission standard being used.

In the example of the first embodiment, in step S306, the PD communication unit 103 exchanges information based on the communication protocol of the USB PD standard, and requests the power transmitting apparatus 120 to perform C-AUTH authentication. The PD communication unit 103 also obtains eMarker information from the cable 122 and performs C-AUTH authentication for the cable 122 as well.

In step S307, the PD communication unit 103 performs control such that an authentication status ("authentication in progress") is displayed in the display unit 106. FIG. 4 is a diagram illustrating an example of the authentication status screen, and an authentication status screen 401 is displayed in step S307. As indicated by the authentication status screen 401, information indicating that the authentication status is "authentication in progress" is displayed for both a USB cable (the cable 122) and a USB-connected device (the power transmitting apparatus 120).

After the C-AUTH authentication is complete, in step S308, the PD communication unit 103 determines whether or not the authenticity of the power transmitting apparatus 120 has been confirmed (whether or not the power transmitting apparatus 120 is authentic). If the power transmitting apparatus 120 is not authentic, the power reception control process proceeds to step S309, whereas if the power transmitting apparatus 120 is authentic, the power reception control process proceeds to step S311.

In step S309, the PD communication unit 103 performs control such that an authentication status screen indicating that the power transmitting apparatus 120 is not authentic is displayed in the display unit 106.

In step S310, the PD communication unit 103 performs control such that information prompting the power transmitting apparatus 120 to be replaced is displayed in the display unit 106.

As a result of the processes of steps S309 and S310, the screen in the display unit 106 moves from the authentication status screen 401 to an authentication status screen 402 (see FIG. 4).

Note that in the example of the authentication status screen 402, the information prompting the power transmitting apparatus 120 to be replaced is text reading "please replace the device", and information indicating a power transmitting apparatus candidate used as a replacement is not included. However, the PD communication unit 103 may be configured such that the information prompting the power transmitting apparatus 120 to be replaced indicates a power transmitting apparatus candidate, by, for example, displaying a model number of the power transmitting apparatus candidate or the like. The same applies when the power reception control process proceeds from step S312 to step S310, which will be described later.

The power transmitting apparatus candidate is, for example, a power transmitting apparatus previously determined to meet the safety condition. In this case, the PD communication unit 103 stores identification information of the power transmitting apparatus 120 when performing the process of step S313, described later (e.g., when the current power transmitting apparatus 120 is determined to meet the safety condition). Accordingly, when performing the process of step S310 later with a different power transmitting apparatus, the PD communication unit 103 can identify a power transmitting apparatus previously determined to meet the safety condition. When the PD communication unit 103 stores the identification information of power transmitting apparatuses (e.g., when power transmitting apparatuses have been previously determined to meet the safety condition), the PD communication unit 103 may select the power transmitting apparatus most recently determined to meet the safety condition as the power transmitting apparatus candidate. Alternatively, the power transmitting apparatus candidate may be a power transmitting apparatus recommended by a manufacturer of the power receiving apparatus 100. In this case, the manufacturer may cause identification information of the recommended power transmitting apparatus to be stored in the PD communication unit 103 when the power receiving apparatus 100 is manufactured, when firmware is updated, or the like.

In step S311, the PD communication unit 103 determines whether or not the power transmitting apparatus 120 has passed a USB-IF (USB Implementers Forum) compliance test (a compliance test for a predetermined power transmission standard). Although the determination method is not particularly limited, for example, the determination can be performed by searching for the identification information (XID) of the power transmitting apparatus 120 obtained in the process of the C-AUTH authentication from a list of identification information (XID) of compliant products provided by the USB-IF. The same applies to the process of step S317 described later. If the power transmitting apparatus 120 has not passed the compliance test, the power reception control process proceeds to step S312, whereas if the power transmitting apparatus 120 has passed the compliance test, the power reception control process proceeds to step S313.

In step S312, the PD communication unit 103 performs control such that an authentication status screen indicating that the power transmitting apparatus 120 has not passed the compliance test is displayed in the display unit 106. Then, the PD communication unit 103 performs the aforementioned process of step S310 (displaying the information prompting the power transmitting apparatus 120 to be replaced).

As a result of the processes of steps S312 and S310, the screen in the display unit 106 transitions from the authentication status screen 401 to an authentication status screen 403 (see FIG. 4).

Note that in FIG. 4, the information displayed in the authentication status screen 402 is different from the information displayed in the authentication status screen 403. In other words, the foregoing describes different information (which is distinguishable) as being displayed when the power transmitting apparatus 120 is not authentic and when the power transmitting apparatus 120 has not passed the compliance test. Here, both instances of information displayed in these two cases indicates that the power transmitting apparatus 120 does not meet the safety condition. The specific details of the information displayed to indicate that the power transmitting apparatus 120 does not meet the safety condition is not particularly limited. Accordingly, the same information, indicating that the power transmitting apparatus 120 does not meet the safety condition, may be displayed when the power transmitting apparatus 120 is not authentic (step S309) and when the power transmitting apparatus 120 has not passed the compliance test (step S312). The same applies to information displayed when the cable 122 is not authentic (step S315) and when the cable 122 has not passed a compliance test (step S318), which will be described later.

In step S313, the PD communication unit 103 performs control such that information indicating that the power transmitting apparatus 120 meets the safety condition (that the power transmitting apparatus 120 is authentic and has passed the compliance test) is displayed in the display unit 106. As a result, the screen in the display unit 106 moves from the authentication status screen 401 to an authentication status screen 404 (see FIG. 4).

In step S314, the PD communication unit 103 determines whether or not the authenticity of the cable 122 has been confirmed (whether or not the cable 122 is authentic). If the cable 122 is not authentic, the power reception control process proceeds to step S315, whereas if the cable 122 is authentic, the power reception control process proceeds to step S317.

In step S315, the PD communication unit 103 performs control such that an authentication status screen indicating that the cable 122 is not authentic is displayed in the display unit 106.

In step S316, the PD communication unit 103 performs control such that information prompting the cable 122 to be replaced is displayed in the display unit 106.

As a result of the processes of steps S315 and S316, the "USB cable" part of the authentication status screen in the display unit 106 (the authentication status screen 402, the authentication status screen 403, or the authentication status screen 404) moves to the state indicated by reference sign 501 in FIG. 5.

Note that with the example of the reference sign 501 indicated in FIG. 5, the information prompting the cable 122 to be replaced is text reading "please replace the cable", and information indicating a cable candidate used as a replacement is not included. However, the PD communication unit 103 may be configured such that the information prompting the cable 122 to be replaced indicates a cable candidate, by, for example, displaying a model number of the cable candidate or the like. The same applies when the power reception control process proceeds from step S318 to step S316, which will be described later.

The cable candidate is, for example, a cable previously determined to meet the safety condition. In this case, the PD communication unit 103 stores identification information of the cable 122 when performing the process of step S319, described later (e.g., when the current cable 122 is determined to meet the safety condition). Accordingly, when performing the process of step S316 later with a different cable, the PD communication unit 103 can identify a cable previously determined to meet the safety condition. When the PD communication unit 103 stores the identification information of cables (e.g., when cables have been previously determined to meet the safety condition), the PD communication unit 103 may select the cable most recently determined to meet the safety condition as the cable candidate. Alternatively, the cable candidate may be a cable recommended by a manufacturer of the power receiving apparatus 100. In this case, the manufacturer may cause identification information of the recommended cable to be stored in the PD communication unit 103 when the power receiving apparatus 100 is manufactured, when firmware is updated, or the like.

In step S317, the PD communication unit 103 determines whether or not the cable 122 has passed a compliance test. If the cable 122 has not passed the compliance test, the power reception control process proceeds to step S318, whereas if the cable 122 has passed the compliance test, the power reception control process proceeds to step S319.

In step S318, the PD communication unit 103 performs control such that an authentication status screen indicating that the cable 122 has not passed the compliance test is displayed in the display unit 106. Then, the PD communication unit 103 performs the aforementioned process of step S316 (displaying the information prompting the cable 122 to be replaced).

As a result of the processes of steps S318 and S316, the "USB cable" part of the authentication status screen in the display unit 106 (the authentication status screen 402, the authentication status screen 403, or the authentication status screen 404) moves to the state indicated by reference sign 502 in FIG. 5.

In step S319, the PD communication unit 103 performs control such that information indicating that the cable 122 meets the safety condition (that the cable 122 is authentic and has passed the compliance test) is displayed in the display unit 106. As a result, the "USB cable" part of the authentication status screen in the display unit 106 (the authentication status screen 402, the authentication status screen 403, or the authentication status screen 404) moves to the state indicated by reference sign 503 in FIG. 5.

In step S320, the PD communication unit 103 determines whether or not the power transmitting apparatus 120 meets the safety condition. If the power transmitting apparatus 120 does not meet the safety condition, the power reception control process proceeds to step S321, whereas if the power transmitting apparatus 120 meets the safety condition, the power reception control process proceeds to step S323.

In step S321, the PD communication unit 103 stops the PD communication and furthermore stops the power reception. In step S322, the PD communication unit 103 performs control such that a power reception/charging stopped state (information indicating that power reception and charging are stopped) is displayed in the display unit 106.

Figure 6A:
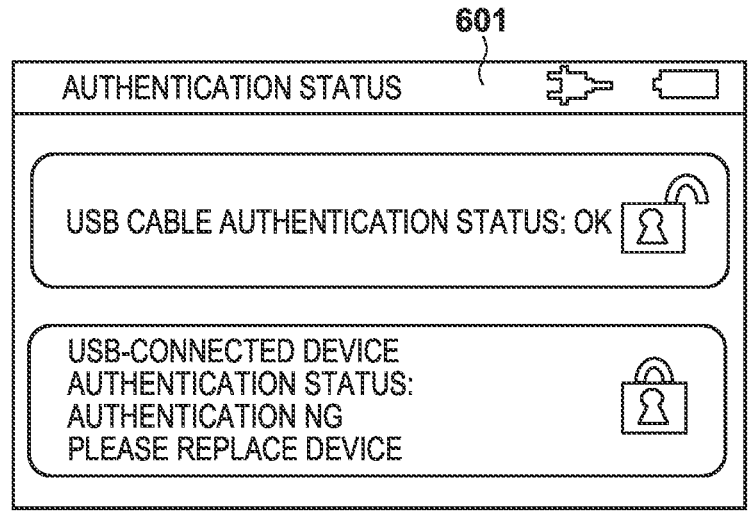
FIGS. 6A to 6C are diagrams illustrating an example of the display of a power reception/charging state.

FIG. 6A is a diagram illustrating an example of the display of the power reception/charging stopped state. Unlike FIGS. 6B and 6C (described later), in FIG. 6A, plug and battery icons displayed in an icon region 601 are not provided with an icon indicating electricity.

In step S323, the PD communication unit 103 determines whether or not the cable 122 meets the safety condition. If the cable 122 meets the safety condition, the power reception control process proceeds to step S324, whereas if the cable 122 does not meet the safety condition, the power reception control process proceeds to step S327.

In step S324, the PD communication unit 103 requests second power from the power transmitting apparatus 120. "Second power" refers to power when the power transmitted from the power transmitting apparatus 120 is not limited (a higher power than the first power described with reference to step S304). In step S325, based on control by the PD communication unit 103, the power receiving unit 104 performs control such that the power to be supplied from the power transmitting apparatus 120 is no greater than the second power. In step S326, the PD communication unit 103 performs control such that a high-power reception/charging state (information indicating that power reception and charging are being performed with high power) is displayed in the display unit 106.

Figure 6B:
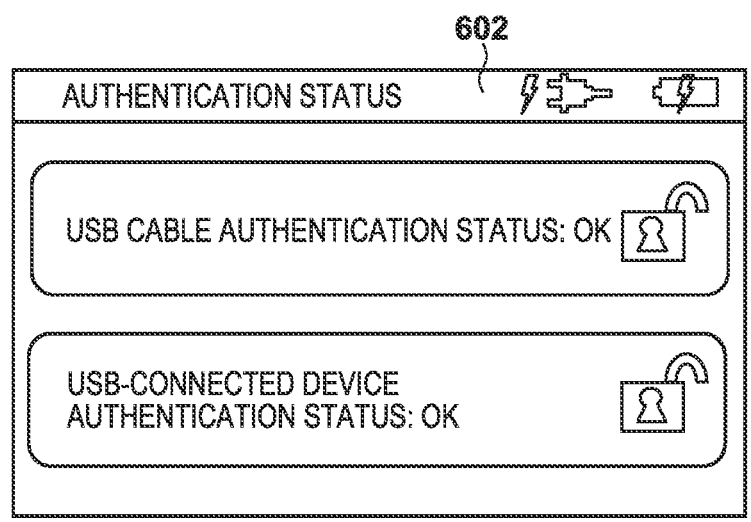

FIG. 6B is a diagram illustrating an example of the display of the high-power reception/charging state. Compared to FIG. 6C (described later), in FIG. 6B, the size of the icon indicating electricity, provided for the plug and battery icons displayed in an icon region 602, is large.

In step S327, the PD communication unit 103 requests third power from the power transmitting apparatus 120. "Third power" refers to power when the power transmitted from the power transmitting apparatus 120 is limited (a lower power than the second power described with reference to step S324). When the cable 122 does not meet the safety condition, the PD communication unit 103 increases the safety by limiting the received power. The third power may be the same as, higher than, or lower than the first power described with reference to step S304. In step S328, based on control by the PD communication unit 103, the power receiving unit 104 performs control such that the power to be supplied from the power transmitting apparatus 120 is no greater than the third power. In step S329, the PD communication unit 103 performs control such that a power reception/charging limited state (information indicating that power reception and charging are limited) is displayed in the display unit 106.

Figure 6C:
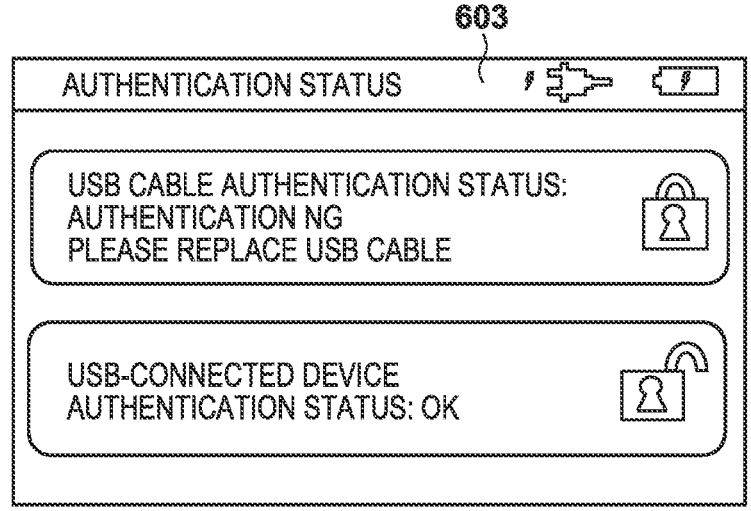

FIG. 6C is a diagram illustrating an example of the display of the power reception/charging limited state. Compared to FIG. 6B (described earlier), in FIG. 6C, the size of the icon indicating electricity, provided for the plug and battery icons displayed in an icon region 603, is small.

In step S330, the PD communication unit 103 waits until a predetermined period has passed following the start of the display in FIG. 6A, FIG. 6B, or FIG. 6C. After the predetermined period has passed, the power reception control process proceeds to step S331. In step S331, the PD communication unit 103 performs control such that the display of the authentication status in the display unit 106 ends. Note that the flowchart illustrated in FIGS. 3A to 3C is an example. There are no limitations on the order of the steps in the flowchart, and the order can be switched.

As illustrated in FIGS. 6A to 6C, according to the first embodiment, the authentication statuses of the power transmitting apparatus 120 and the cable 122 are displayed at the same time as the power reception/charging state. Additionally, as illustrated in FIGS. 6A and 6C, when the power reception/charging are stopped or limited, information indicating a method for solving the problem (replacing the power transmitting apparatus 120 or the cable 122) is displayed. This makes it easy for a user to understand the situation and improves the convenience.

As described above, according to the first embodiment, the power receiving apparatus 100 determines whether or not the power transmitting apparatus 120 and the cable 122 respectively meet the safety condition (a predetermined condition relating to the safety of power transmission). If the power transmitting apparatus 120 does not meet the safety condition, the power receiving apparatus 100 displays information indicating that the power transmitting apparatus 120 does not meet the safety condition. Additionally, if the cable 122 does not meet the safety condition, the power receiving apparatus 100 displays information indicating that the cable 122 does not meet the safety condition. The first embodiment therefore makes it easy for a user to determine when only the power transmitting apparatus 120 does not meet the safety condition, when only the cable 122 does not meet the safety condition, and when both the power transmitting apparatus 120 and the cable 122 do not meet the safety condition.

Second Embodiment

At least one of the various functions, processes, and methods described in the foregoing embodiments can be realized using a program. Hereinafter, in a second embodiment, a program for realizing at least one of the various functions, processes, and methods described in the foregoing embodiment will be called a "program X". Furthermore, in the second embodiments, a computer for executing the program X will be called a "computer Y". A personal computer, a microcomputer, a CPU (Central Processing Unit), or the like are examples of the computer Y.

At least one of the various functions, processes, and methods described in the foregoing embodiments can be realized by the computer Y executing the program X. In this case, the program X is supplied to the computer Y via a computer-readable storage medium. The computer-readable storage medium in the second embodiment includes at least one of a hard disk device, a magnetic storage device, an optical storage device, a magneto-optical storage device, a memory card, ROM, RAM, or the like. Furthermore, the computer-readable storage medium in the second embodiment is a non-transitory storage medium.

While aspects of the disclosure are described with reference to exemplary embodiments, it is to be understood that the aspects of the disclosure are not limited to the exemplary embodiments. The scope of the following claims is to be accorded the broadest interpretation so as to encompass all such modifications and equivalent structures.

This application claims the benefit of Japanese Patent Application No. 2020-135066, filed Aug. 7, 2020, which is hereby incorporated by reference herein in its entirety.

What is claimed is:

1. A power receiving apparatus that receives power from a power transmitting apparatus via a cable in accordance with USB Power Delivery standard (USB PD standard), comprising:
   a central processing unit (CPU); and
   a memory storing a program which, when executed by the CPU, causes the power receiving apparatus to function as:
   a power receiving unit that receives power from the power transmitting apparatus via the cable,
   wherein one plug of one end of the cable is connected to the power receiving apparatus and another plug of another end of the cable is connected to the power transmitting apparatus;
   a determination unit that performs a predetermined authentication process relating to the USB PD standard on the power transmitting apparatus connected to the cable for determining whether or not the power transmitting apparatus meets a predetermined condition relating to safety of power transmission and performs the predetermined authentication process on the cable connected to the power receiving apparatus and the power transmitting apparatus for determining whether or not the cable meets the predetermined condition; and
   a display unit that displays first information indicating that the power transmitting apparatus does not meet the predetermined condition in a case where the determination unit determines that the power transmitting apparatus does not meet the predetermined condition, and displays second information indicating that the cable does not meet the predetermined condition in a case where the determination unit determines that the cable does not meet the predetermined condition,
   wherein the first information includes information prompting the power transmitting apparatus to be replaced, and the second information includes information prompting the cable to be replaced, and
   wherein the information prompting the power transmitting apparatus to be replaced is configured to indicate a power transmitting apparatus candidate, and the information prompting the cable to be replaced is configured to indicate a cable candidate.

2. The power receiving apparatus according to claim 1, wherein the determination unit:
   performs the predetermined authentication process on each of the power transmitting apparatus and the cable based on a predetermined authentication standard relating to the USB PD standard;
   determines whether or not each of the power transmitting apparatus and the cable is authentic based on a result of the authentication process on each of the power transmitting apparatus and the cable;
   determines that the power transmitting apparatus does not meet the predetermined condition in a case where the power transmitting apparatus is not authentic; and
   determines that the cable does not meet the predetermined condition in a case where the cable is not authentic.

3. The power receiving apparatus according to claim 2, wherein the determination unit:
   determines whether or not the power transmitting apparatus has passed a predetermined compliance test relating to the USB PD standard, in a case where the power transmitting apparatus is authentic;
   determines whether or not the cable has passed the predetermined compliance test in a case where the cable is authentic;
   determines that the power transmitting apparatus does not meet the predetermined condition in a case where the power transmitting apparatus is authentic but has not passed the predetermined compliance test;
   determines that the power transmitting apparatus meets the predetermined condition in a case where the power transmitting apparatus is authentic and has passed the predetermined compliance test;
   determines that the cable does not meet the predetermined condition in a case where the cable is authentic but has not passed the predetermined compliance test; and
   determines that the cable meets the predetermined condition in a case where the cable is authentic and has passed the predetermined compliance test.

4. The power receiving apparatus according to claim 3, wherein the first information is configured to distinguish between a case where the power transmitting apparatus is authentic but has not passed the predetermined compliance test and a case where the power transmitting apparatus is not authentic, and
   the second information is configured to distinguish between a case where the cable is authentic but has not passed the predetermined compliance test and a case where the cable is not authentic.

5. The power receiving apparatus according to claim 1, wherein the power transmitting apparatus candidate is a power transmitting apparatus previously determined by the determination unit to meet the predetermined condition, and
   the cable candidate is a cable previously determined by the determination unit to meet the predetermined condition.

6. The power receiving apparatus according to claim 5, wherein the power transmitting apparatus candidate is a power transmitting apparatus most recently determined by the determination unit to meet the predetermined condition, in a case where power transmitting apparatuses have been previously determined by the determination unit to meet the predetermined condition, and
   the cable candidate is a cable most recently determined by the determination unit to meet the predetermined condition, in a case where cables have been previously determined by the determination unit to meet the predetermined condition.

7. The power receiving apparatus according to claim 1, wherein the power transmitting apparatus candidate is a predetermined power transmitting apparatus recommended by a manufacturer of the power receiving apparatus, and the cable candidate is a predetermined cable recommended by the manufacturer of the power receiving apparatus.

8. The power receiving apparatus according to claim 1, wherein the power receiving unit stops receiving the power supplied from the power transmitting apparatus via the cable, in a case where the power transmitting apparatus does not meet the predetermined condition.

9. The power receiving apparatus according to claim 1, wherein the display unit displays third information indicating that the power transmitting apparatus meets the predetermined condition in a case where the power transmitting apparatus meets the predetermined condition, and displays fourth information indicating that the cable meets the predetermined condition in a case where the cable meets the predetermined condition.

10. A control method of a power receiving apparatus that receives power from a power transmitting apparatus via a cable in accordance with USB Power Delivery standard (USB PD standard), comprising:

receiving power from the power transmitting apparatus via the cable, wherein one plug of one end of the cable is connected to the power receiving apparatus and another plug of another end of the cable is connected to the power transmitting apparatus;

performing a predetermined authentication process relating to the USB PD standard on the power transmitting apparatus connected to the cable for determining whether or not the power transmitting apparatus meets a predetermined condition relating to safety of power transmission;

performing the predetermined authentication process on the cable connected to the power receiving apparatus and the power transmitting apparatus for determining whether or not the cable meets the predetermined condition;

displaying first information indicating that the power transmitting apparatus does not meet the predetermined condition in a case where the power transmitting apparatus does not meet the predetermined condition; and displaying second information indicating that the cable does not meet the predetermined condition in a case where the cable does not meet the predetermined condition, wherein the first information includes information prompting the power transmitting apparatus to be replaced, and the second information includes information prompting the cable to be replaced, and wherein the information prompting the power transmitting apparatus to be replaced is configured to indicate a power transmitting apparatus candidate, and the information prompting the cable to be replaced is configured to indicate a cable candidate.

11. A non-transitory storage medium which stores a program for causing a computer to execute a control method of a power receiving apparatus that receives power from a power transmitting apparatus via a cable in accordance with USB Power Delivery standard (USB PD standard), the method comprising:

receiving power from the power transmitting apparatus via the cable, wherein one plug of one end of the cable is connected to the power receiving apparatus and another plug of another end of the cable is connected to the power transmitting apparatus;

performing a predetermined authentication process relating to the USB PD standard on the power transmitting apparatus connected to the cable for determining whether or not the power transmitting apparatus meets a predetermined condition relating to safety of power transmission;

performing the predetermined authentication process on the cable connected to the power receiving apparatus and the power transmitting apparatus for determining whether or not the cable meets the predetermined condition;

displaying first information indicating that the power transmitting apparatus does not meet the predetermined condition in a case where the power transmitting apparatus does not meet the predetermined condition; and displaying second information indicating that the cable does not meet the predetermined condition in a case where the cable does not meet the predetermined condition, wherein the first information includes information prompting the power transmitting apparatus to be replaced, and the second information includes information prompting the cable to be replaced, and wherein the information prompting the power transmitting apparatus to be replaced is configured to indicate a power transmitting apparatus candidate, and the information prompting the cable to be replaced is configured to indicate a cable candidate.

\* \* \* \* \*